(12) United States Patent
Weiss

(10) Patent No.: US 8,277,236 B2
(45) Date of Patent: Oct. 2, 2012

(54) CALIBRATION ADAPTER

(75) Inventor: Frank Weiss, Bernsdorf (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 595 days.

(21) Appl. No.: 12/532,658

(22) PCT Filed: Jan. 31, 2008

(86) PCT No.: PCT/EP2008/000790
§ 371 (c)(1),
(2), (4) Date: Sep. 23, 2009

(87) PCT Pub. No.: WO2008/116522
PCT Pub. Date: Oct. 2, 2008

(65) Prior Publication Data
US 2010/0120287 A1    May 13, 2010

(30) Foreign Application Priority Data
Mar. 23, 2007  (DE) .................... 20 2007 004 296 U

(51) Int. Cl.
*H01R 29/00* (2006.01)
(52) U.S. Cl. .......... 439/169; 439/63; 439/167; 439/219; 439/912
(58) Field of Classification Search .................. 439/63, 439/166, 167, 169, 219, 912
See application file for complete search history.

(56) References Cited

U.S. PATENT DOCUMENTS

| | | | |
|---|---|---|---|
| 4,967,173 A | 10/1990 | Watson | |
| 5,091,709 A | 2/1992 | Pollard | |
| 6,997,753 B2 * | 2/2006 | Broomall et al. | 439/638 |
| 7,416,443 B2 * | 8/2008 | Weiss et al. | 439/578 |
| 2004/0051538 A1 * | 3/2004 | Adamian | 324/601 |
| 2006/0051996 A1 * | 3/2006 | Panzar et al. | 439/169 |
| 2007/0218755 A1 * | 9/2007 | Weiss et al. | 439/578 |
| 2010/0120287 A1 * | 5/2010 | Weiss | 439/581 |

FOREIGN PATENT DOCUMENTS

DE    20 2004 013305    11/2004

* cited by examiner

*Primary Examiner* — James Harvey
(74) *Attorney, Agent, or Firm* — DeLio & Peterson, LLC; Robert Curcio, Esquire

(57) ABSTRACT

A calibration adapter with coaxial connector for connecting to a complementary coaxial connector of a device to be calibrated, where the coaxial connector has an inner conductor part, an outer conductor part arranged coaxially thereto, and a male termination. The calibration adapter has a drum where at least two calibration standards are arranged, the drum is rotatably arranged on a pin connected centrally to a first cap such that a longitudinal axis of the pin is flush with a longitudinal axis of the first cap. The coaxial connector with a second termination opposite the male termination, is connected eccentrically to the longitudinal axis of the first cap, and the at least two calibration standards are arranged in the drum such that by the rotation of the drum relative to the first cap, the second termination can be optionally connected to one of the calibration standards.

22 Claims, 4 Drawing Sheets

CALIBRATION ADAPTER

This application is a National Phase filing under 35 U.S.C. §371 of PCT/EP2008/000790 filed Jan. 31, 2008, and claims priority to German Application No. DE 20 2007 004 296.5 filed Mar. 23, 2007.

BACKGROUND OF THE INVENTION

1. Field of the Invention

The invention relates to a calibration adapter with a coaxial connector, in particular a coaxial plug or coaxial socket or coaxial coupler, for connecting to a coaxial connector of a device to be calibrated, in particular to a measurement port of a vectorial network analyzer (VNA), wherein the coaxial connector has an inner conductor part, an outer conductor part arranged coaxially thereto, and a male termination which can be connected to the coaxial connector of the device to be calibrated.

2. Description of Related Art

The high accuracy of the vectorial network analyzer (VNA) is based on the fact that the network analyzer is calibrated prior to actually measuring the amount and phase of the complex reflection coefficient by connecting calibrating standards to its measurement ports. In the meantime there is now a plurality of different calibration methods. Most calibration methods use open-circuit, short-circuit and adaptive calibration standards for system calibration. By connecting these calibration standards to the measurement ports of the network analyzer, the faults arising in the network analyzer which cause the measured values to deviate from the true value, can be ascertained and used during subsequent object measuring for mathematical fault correction. This is known, for example, from the DE 39 12 795 A1.

A typical calibration standard with short-circuited precision air line is known, for example, from the DE 20 2004 013 305. By means of a detachable short-circuit between inner conduct part and outer conductor part in conjunction with an adjusting mechanism a high-quality precision measuring means for an accurately adjustable displacement amount between inner conductor part and reference plane (the contact face of the outer conductor) of the coaxial coupler of the calibration standard is available, which can be adapted to any given displacement amounts between contact faces of the outer conductor and the inner conductor on the coaxial coupler of the device to be calibrated and will also equalize any component tolerances in the displacement amount.

SUMMARY OF THE INVENTION

Bearing in mind the problems and deficiencies of the prior art, it is therefore an object of the present invention to improve a calibration adapter of the above-mentioned kind.

According to the invention this requirement is met by a calibration adapter of the above-mentioned kind with the characterizing features defined in claim 1. Advantageous further developments of the invention are described in the other claims.

Still other objects and advantages of the invention will in part be obvious and will in part be apparent from the specification.

The above and other objects, which will be apparent to those skilled in the art, are achieved in the present invention, which is directed to a calibration adapter having a drum in which at least two calibration standards are arranged, wherein the drum is rotatably arranged on a pin which is connected centrally to a first cap in such a way that a longitudinal axis of the pin is flush with a longitudinal axis of the first cap, wherein the coaxial connector, with a second termination opposite to the male termination, is connected to the first cap eccentrically to the longitudinal axis of the first cap, and the calibration standards are arranged in the drum in such a way that by rotating the drum relative to the first cap, the second termination opposite to the male termination of the coaxial conductor can be optionally connected to one of the calibration standards.

The advantage of this is that by way of a single connection of the calibration adapter with a coaxial connector of a device to be calibrated several different calibration standards are available without having to plug-in a new part for each calibration adapter on the coaxial connector of the device to be calibrated. Thus different calibration standards can be employed with one and the same unchanged plug-in connection which increases the accuracy of the calibration. At the same time the construction of the calibration adapter is mechanically easy and inexpensive and operation of the calibration adapter is easy. In addition the electrical characteristics are improved.

In an advantageous embodiment the drum comprises four different calibration standards.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
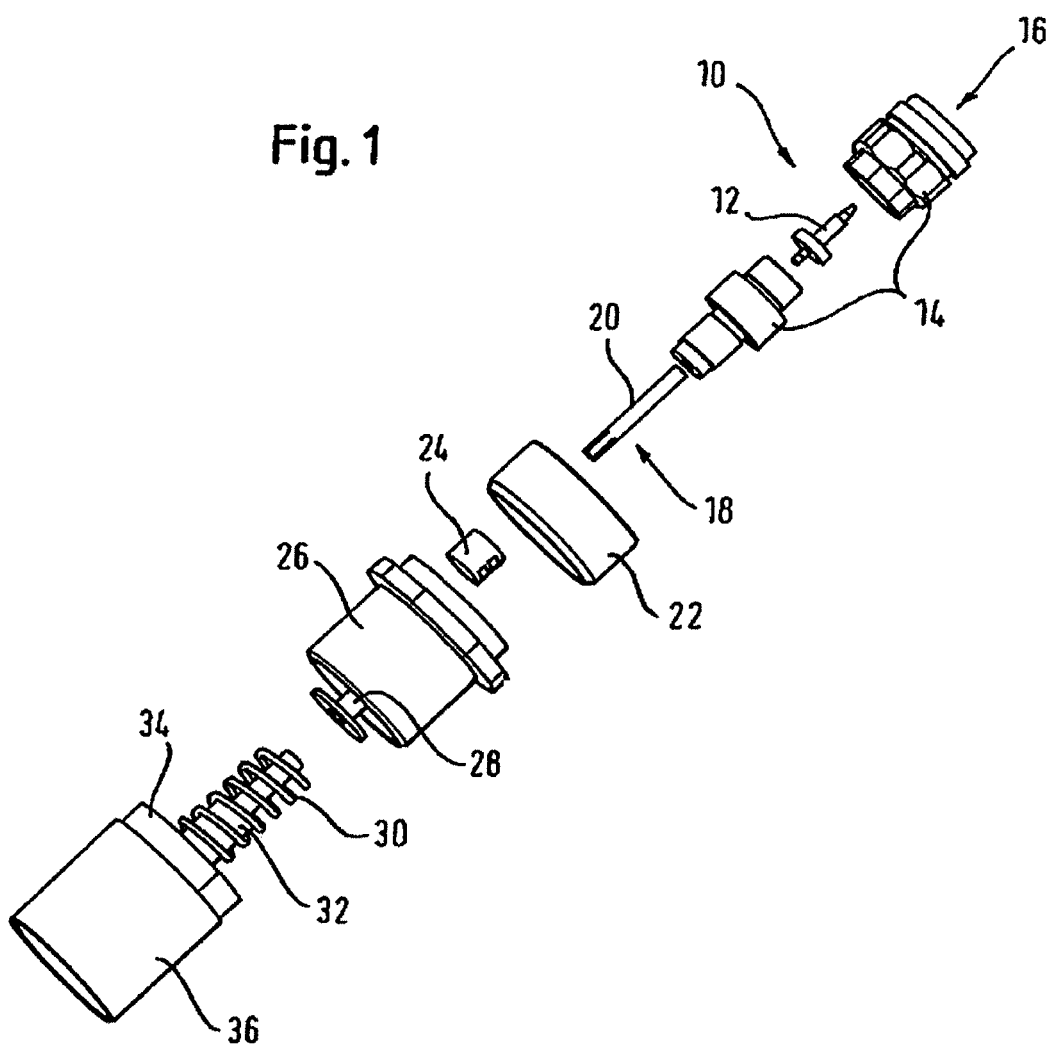
FIG. 1 shows an exploded view of a preferred embodiment of a calibration adapter according to the invention.

In describing the preferred embodiment of the present invention, reference will be made herein to FIGS. 1-9 of the drawings in which like numerals refer to like features of the invention.

As is normal, the calibration standards include a short-circuit, which electrically short-circuits the inner conductor part of the coaxial connector with the outer conductor part of the coaxial connector, an open-circuit, a termination impedance and/or a mismatch.

Conveniently the calibration standards are arranged in the drum in circumferential direction spaced equally apart from each other.

In a preferred embodiment the outer conductor part is screwed to the first cap.

Conveniently the first cap is screwed to the pin.

In a preferred further embodiment of the invention the pin is screwed to a second cap at one end facing away from the first cap.

In order to cause the drum to press in direction of the first cap and thereby the calibration standards to press against the second end of the coaxial connector, an elastic spring device is provided which acts with force upon the second cap and the drum in axial direction pushing them apart. This spring device is, for example, a helical spring which is arranged coaxially to the pin.

To guide the drum the drum preferably comprises a socket-shaped extension extending in axial direction, which engages in the second cap.

In order to achieve, as far as possible, friction-free sliding during rotation of the drum relative to the pin and to the second cap, a second sliding part is arranged between the socket-shaped extension of the drum and the second cap, and a first sliding part is arranged between the drum and the pin.

Due to the fact that a spring element is arranged spaced radially apart from the pin between the first cap and the drum, which acts with force upon the drum and the first cap pushing them apart, a force acting asymmetrically upon the drum relative to the pin results, which tilts the drum out of the non-flush position relative to the pin and to the first cap, thereby improving the contact pressure between one of the calibration standards arranged inside the drum and the second termination of the coaxial connector. It is especially advantageous if the spring element, with this arrangement, is arranged radially opposite to the coaxial connector and is fastened to the first cap.

A particularly inexpensive and reliable calibration adapter is realized by forming at least one of the calibration standards in one piece with the drum.

Conveniently the coaxial connector is connected with the first cap in such a way that a longitudinal axis of the coaxial connector extends in parallel with a longitudinal axis of the first cap.

In order to prevent the inner conductor part from knocking laterally against the rim of one of the recesses for the calibration standards during rotation of the drum relative to the first cap and possibly causing it to shear-off, an annular groove is formed on a side of the drum facing the first cap, which connects recesses in the drum for the calibration standards with each other and makes a free space available for the inner conductor part.

Figure 2:
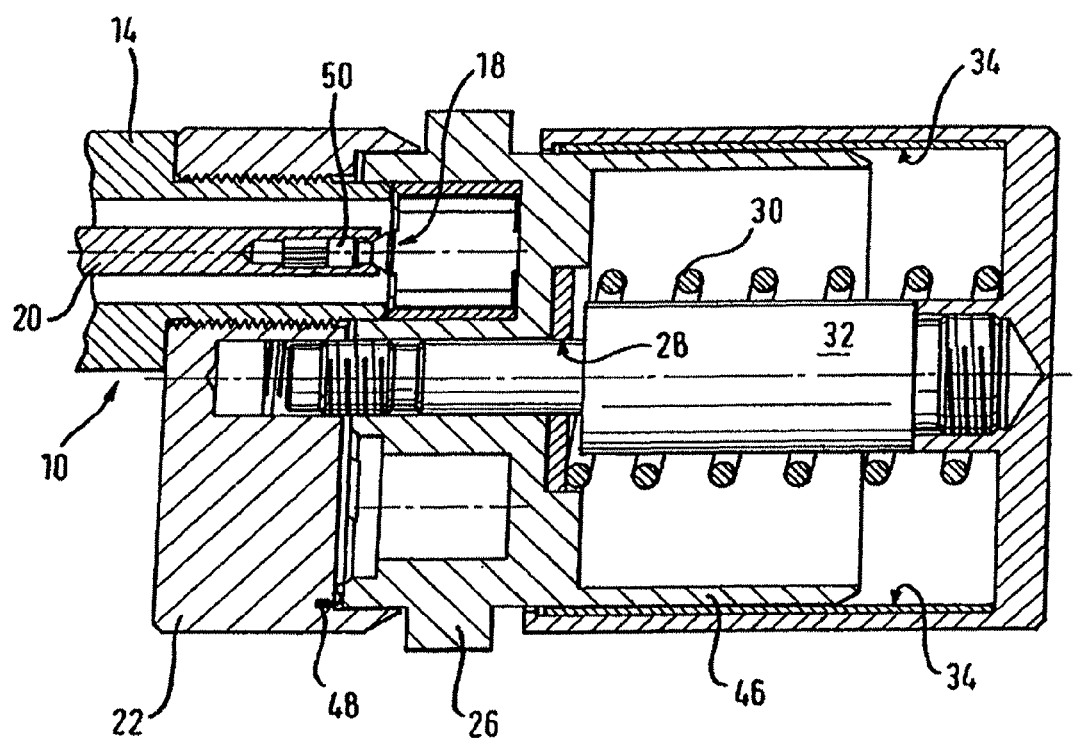
FIG. 2 shows a sectional view of the calibration adapter in FIG. 1.

The preferred embodiment of a calibration adapter according to the invention shown in FIGS. 1 and 2 comprises a coaxial connector 10, which has an inner conductor part 12, an outer conductor part 14, a male termination 16 as well as a second termination 18 opposite the male termination 16, a contact pin 20, a first cap 22, an element 24 for a calibration standard, a drum 26, in which four calibration standards are arranged, a first sliding part 28, a pressure spring 30, a pin 32, a second sliding part 34 and a second cap 36.

The pin 32 is centrically connected with the first cap 22 in such a way that a longitudinal axis of pin 32 is flush with a longitudinal axis of first cap 22. The drum 26 is rotatably arranged on pin 32. The coaxial connector 10, with the second termination 18, is eccentrically connected, i.e. spaced radially apart from the longitudinal axis of the first cap 22, with the first cap 22. The coaxial connector 10, with its second termination 18, is screwed to the first cap 22.

Figure 3:
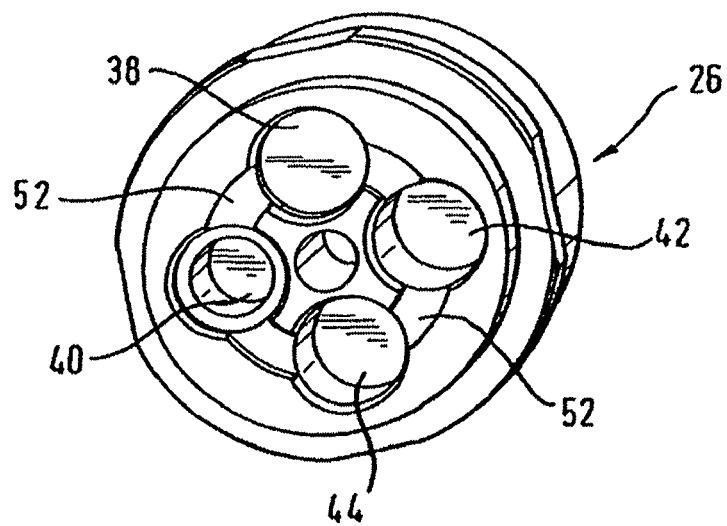
FIG. 3 shows a perspective view of a drum of the calibration adapter in FIGS. 1 and 2.
Figure 4:
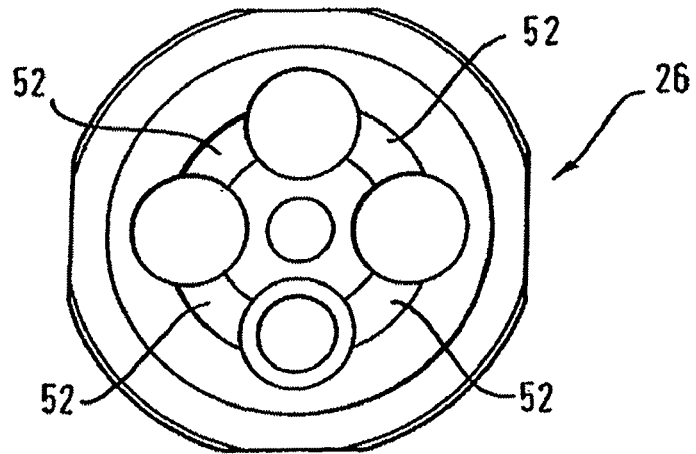
FIG. 4 shows a plan view of the drum in FIG. 3.
Figure 5:
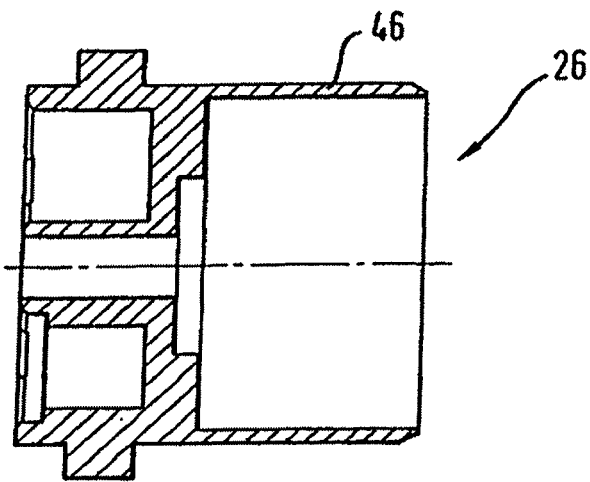
FIG. 5 shows a sectional view of the drum in FIG. 3.

As can be seen in FIGS. 3 to 5, in particular, four different calibration standards, i.e. a short-circuit 38, an open-circuit 40, a terminating resistance 42 as well as a mismatch 44, are arranged in circumferential direction, spaced equally apart from each other as well as from pin 32 in radial direction, in such a way that depending upon the position of drum 26 always one of the calibration standards 38, 40, 42, 44 contacts the second termination 18 of coaxial connector 10. By rotating the drum 26 about the pin 32 relative to the first cap 22 one desired calibration standard 38, 40, 42, 44 can be respectively connected with the coaxial connector 10.

The drum 26 has an axially extending socket-shaped elevation 46 which extends into the second cap 36. The first sliding part 28 is arranged between the pin 32 and the drum 26. The second sliding part 34 is arranged between the socket-shaped elevation 46 of drum 26 and the second cap 36. Both sliding parts 28, 34 ensure, as far as possible, a friction-free relative movement of drum 26 relative to the pin 32 and to the second cap 36.

In order to hold the arrangement of first cap 22, drum 26 and second cap 36 together, one end of pin 32 is screwed to the first cap 22 and the opposite end of pin 32 is screwed to the second cap 36.

The helical spring 30 coaxially surrounding the pin 32 is arranged pre-tensioned between the drum 26 and the second cap 36, thereby pressing the drum 26 in direction of the first cap 22 and causing it to knock against the outer conductor 14 of coaxial connector 10. This causes one of the calibration standards 38, 40, 42, 44 to be pressed against the second termination 18 of coaxial connector 10 thereby establishing a good electrical contact between the second termination 18 of coaxial connector 10 and the respective calibration standard 38, 40, 42, 44. In order to rotate the drum 26 the drum is manually displaced on the pin 32 in axial direction away from the first cap 22 in direction of the second cap 36, held in this axially displaced position and, at the same time, rotated relative to the first cap 22, until a desired calibration standard 38, 40, 42, 44 is flush with the second termination 18 of coaxial connector 10. The drum 26, after releasing it, returns to its original position due to the force of spring 30, in which position one of the calibration standards 38, 40, 42, 44 knocks against the face of second termination 18 of coaxial connector 10 and is pressed against it by the spring 30.

In addition, as revealed in FIG. 2, a spring element 48 is arranged on the first cap 22 spaced radially apart and opposite the second termination 18 of coaxial connector 10 in radial direction. This spring element 48 causes a force to act asymmetrically upon the drum 26, thereby causing the drum 26 to tilt out of the non-flush position relative to the first cap and result in a contact pressure between the second termination 18 of coaxial connector 10 and a respective calibration standard 38, 40, 42, 44. This initially non-flush position of drum 26 relative to the first cap 22 results from the fact that the drum 26 knocks against the outer conductor 14 of coaxial connector 10 and not against the cap 22 as such.

Figure 6:
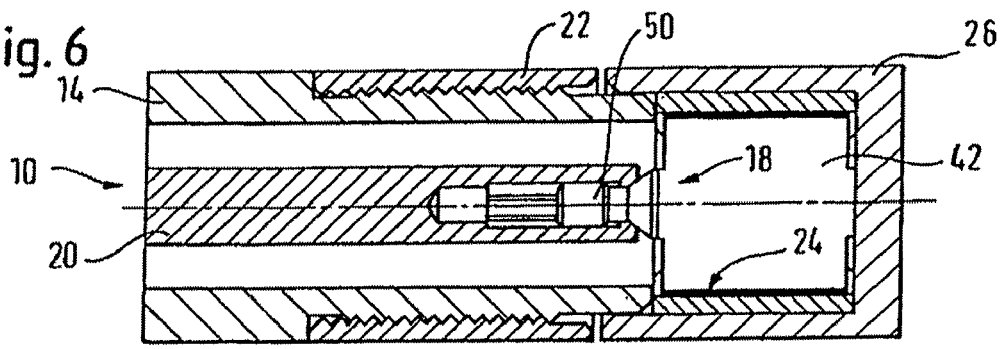
FIG. 6 shows a sectional view of the calibration adapter in FIGS. 1 and 2 with a calibration standard in the form of a termination.
Figure 7:
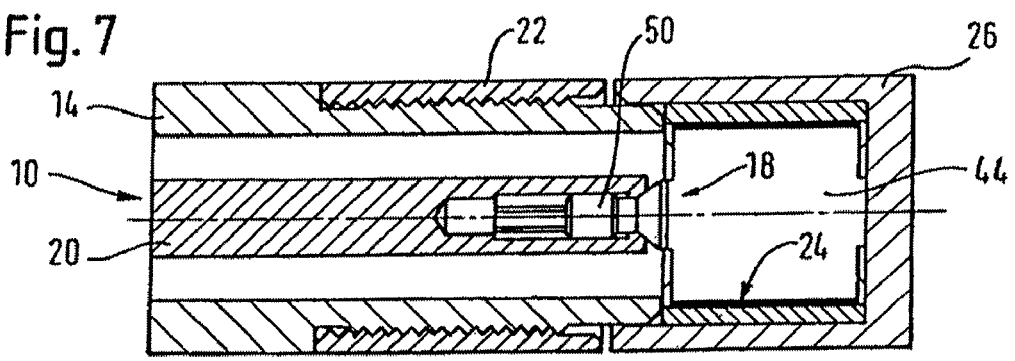
FIG. 7 shows a sectional view of the calibration adapter in FIGS. 1 and 2 with a calibration standard in the form of a mismatch.
Figure 8:
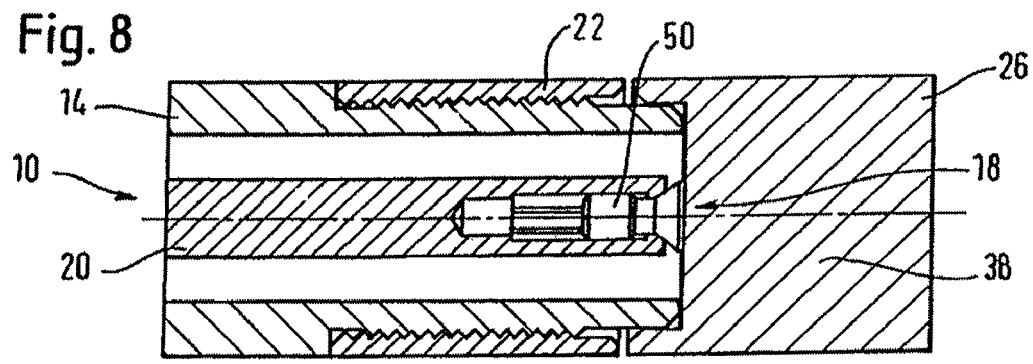
FIG. 8 shows a sectional view of the calibration adapter in FIGS. 1 and 2 with a calibration standard in the form of a short-circuit.
Figure 9:
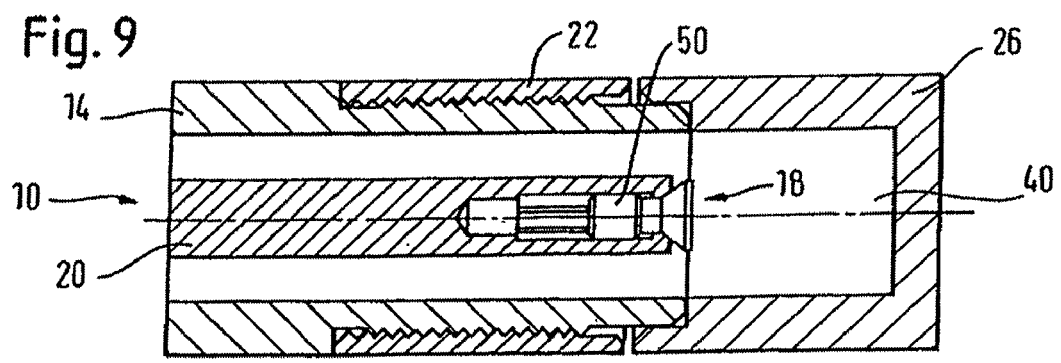
FIG. 9 shows a sectional view of the calibration adapter in FIGS. 1 and 2 with a calibration standard in the form of an open-circuit.

FIGS. 6 to 9 show four different calibration standards and the way of making contact with the second termination 18 of coaxial connector 10. At the second termination 18 of coaxial connector 10, on contact pin 20 of inner conductor part not shown in detail in FIGS. 6 to 9 in other respects, a contact bolt 50 is arranged so as to be spring-loaded in axial direction, thereby evening out any tolerances. FIG. 6 shows a termination 42, FIG. 7 a mismatch 44, FIG. 8 a short-circuit 38, and FIG. 9 an open-circuit 40. Termination 42 and mismatch 44 are formed as plug-in sockets for a corresponding recess in drum 26. Open-circuit 40 is formed as an empty recess in drum 26. Short-circuit 38 is formed in one piece with drum 26.

On the side of the drum 26 facing the first cap 22 an annular groove 52 has been formed as shown in FIGS. 3 and 4, which connects the recesses in drum 26 for the calibration standards 38, 40, 42, 44 with each other. This annular groove 52 is used as free space for the spring-loaded contact bolts 50 during rotation of drum 26 relative to the first cap 22 and thereby prevents a contact bolt 50 from laterally knocking against the rim of one of the recesses for the calibration standards 38, 40, 42, 44 and possibly preventing it from shearing-off.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A calibration adapter with coaxial connector having a coaxial plug or coaxial socket or coaxial coupler, for connecting to a coaxial connector of a device to be calibrated, wherein the coaxial connector comprises:
an inner conductor part; an outer conductor part arranged coaxially thereto; and
a male termination connectable to the coaxial connector of the device to be calibrated;
said calibration adapter including:
a drum comprising at least two calibration standards, said drum rotatably arranged on a pin which is connected centrally to a first cap such that a longitudinal axis of the pin is flush with a longitudinal axis of the first cap, wherein the coaxial connector, including a second termination opposite to the male termination, is connected eccentrically to the longitudinal axis of the first cap, and the at least two calibration standards are arranged in the drum such that by rotating the drum relative to the first cap, the second termination opposite to the male termination of the coaxial connector can be optionally connected with one of the at least two calibration standards.

2. The calibration adapter with coaxial connector of claim 1, wherein said drum comprises four different calibration standards.

3. The calibration adapter with coaxial connector of claim 1 including the at least two calibration standards comprising a short-circuit, which electrically short-circuits the inner conductor part of the coaxial connector with the outer conductor part of the coaxial connector, an open-circuit, a termination impedance and a mismatch (44), or any combination of at least tow thereof.

4. The calibration adapter with coaxial connector of claim 1 including having said at least two calibration standards arranged in the drum in circumferential direction spaced equally apart from each other.

5. The calibration adapter with coaxial connector of claim 1 including having the outer conductor part screwed to the first.

6. The calibration adapter with coaxial connector of claim 1 including having the first cap screwed to the pin.

7. The calibration adapter with coaxial connector of claim 1 including having the pin screwed to the second cap at the end of the pin facing away from the first cap.

8. The calibration adapter with coaxial connector of claim 7, comprising a spring device for elastically acting with force upon the second cap and the drum in axial direction pushing them apart.

9. The calibration adapter with coaxial connector of claim 8 including having the spring device as a helical spring arranged coaxially to the pin.

10. The calibration adapter with coaxial connector of claim 7 wherein the drum includes a socket-shaped extension extending in axial direction, which engages in the second cap.

11. The calibration adapter with coaxial connector of claim 10 including having a second sliding part arranged between the socket-shaped extension of the drum and the second cap.

12. The calibration adapter with coaxial connector of claim 1 including a first sliding part arranged between the drum and the pin.

13. The calibration adapter with coaxial connector of claim 1 wherein between the first cap and the drum a spring element is arranged spaced radially apart from the pin, which acts with force upon the drum and the first cap pushing them apart.

14. The calibration adapter with coaxial connector of claim 13 including having the spring element arranged radially opposite to the coaxial connector.

15. The calibration adapter with coaxial connector of claim 13 including having the spring element fastened to the first cap.

16. The calibration adapter with coaxial connector of claim 1 including having at least one of the at least two calibration standards formed in one piece with the drum.

17. The calibration adapter with coaxial connector of claim 1 including the coaxial connector connected with the first cap such that a longitudinal axis of the coaxial connector extends in parallel to the longitudinal axis of the first cap.

18. The calibration adapter with coaxial connector of claim 1 including an annular groove formed on the side of drum facing the first cap for connecting recesses in the drum for the at least two calibration standards with each other.

19. The calibration adapter with coaxial connector of claim 5 including having the first cap screwed to the pin.

20. The calibration adapter with coaxial connector of claim 6 including having the pin screwed to the second cap at the end of the second cap facing away from the first cap.

21. The calibration adapter with coaxial connector of claim 8 wherein the drum includes a socket-shaped extension extending in axial direction, which engages in the second cap.

22. The calibration adapter with coaxial connector of claim 7 including a first sliding part arranged between the drum and the pin.

* * * * *

UNITED STATES PATENT AND TRADEMARK OFFICE
CERTIFICATE OF CORRECTION

| | | |
|---|---|---|
| PATENT NO. | : 8,277,236 B2 | Page 1 of 1 |
| APPLICATION NO. | : 12/532658 | |
| DATED | : October 2, 2012 | |
| INVENTOR(S) | : Frank Weiss | |

It is certified that error appears in the above-identified patent and that said Letters Patent is hereby corrected as shown below:

In the Claims

In column 5, line 54, claim 3, delete "tow" and substitute therefor -- two --.

Signed and Sealed this
Twenty-ninth Day of October, 2013

Teresa Stanek Rea
*Deputy Director of the United States Patent and Trademark Office*